United States Patent
Sandhu et al.

[19]

[11] Patent Number: 5,949,117
[45] Date of Patent: Sep. 7, 1999

[54] HIGHLY EFFICIENT TRANSISTOR FOR FAST PROGRAMMING OF FLASH MEMORIES

[75] Inventors: Gurtej Singh Sandhu; Pierre Fazan, both of Boise, Id.

[73] Assignee: Micron Technology, Inc., Boise, Id.

[21] Appl. No.: 08/580,459

[22] Filed: Dec. 26, 1995

[51] Int. Cl.⁶ .................................................. H01L 29/76
[52] U.S. Cl. ........................................... 257/410; 257/411
[58] Field of Search .................................... 257/410, 411, 257/315, 321

[56] References Cited

U.S. PATENT DOCUMENTS

| | | | |
|---|---|---|---|
| 4,852,062 | 7/1989 | Baker et al. | 365/185 |
| 5,278,087 | 1/1994 | Jeng | 437/43 |
| 5,338,954 | 8/1994 | Shimoji | 257/326 |
| 5,362,685 | 11/1994 | Gardner et al. | 437/238 |
| 5,411,911 | 5/1995 | Ikeda et al. | 437/52 |
| 5,432,106 | 7/1995 | Hong | 437/35 |
| 5,445,983 | 8/1995 | Hong | 437/43 |
| 5,453,388 | 9/1995 | Chen et al. | 437/30 |
| 5,459,091 | 10/1995 | Hwang | 437/43 |
| 5,751,017 | 5/1998 | Jang et al. | 257/411 |

OTHER PUBLICATIONS

Robinson, "Endurance Brightens the Future of Flash", Electronic Component News, Nov. 1988, Reprinted in Nonvolatile Semiconductor Memories Technologies, design and Applications, IEEE Press pp. 167–168.

*Primary Examiner*—Mark V. Prenty
*Attorney, Agent, or Firm*—Reed, Smith, Shaw & McClay LLP

[57] ABSTRACT

In a semiconductor fabrication method for forming a transistor structure upon a semiconductor substrate, a nitride layer is also formed over the semiconductor substrate. A gate oxide layer is formed over a region of the semiconductor substrate. The gate oxide layer has a relatively thinner oxide region over the nitride layer and a relatively thicker oxide region over the substrate adjacent the nitride layer. A transistor gate is formed extending over the relatively thinner oxide region and over the relatively thicker oxide region. The transistor thus formed is therefore asymmetric. A first transistor active region is formed in the vicinity of the relatively thicker oxide region and a second transistor active region is formed in the vicinity of the relatively thinner oxide region. The nitride layer can be formed by rapid thermal nitridization of the semiconductor substrate. The relatively thinner oxide region can be one-half as thick as the relatively thinner oxide region. The surface of the semiconductor substrate can be curved in the vicinity of the drain of the asymmetric transistor in order to permit the momentum of the charge carriers to facilitate penetration of the charge carriers into the gate.

16 Claims, 3 Drawing Sheets

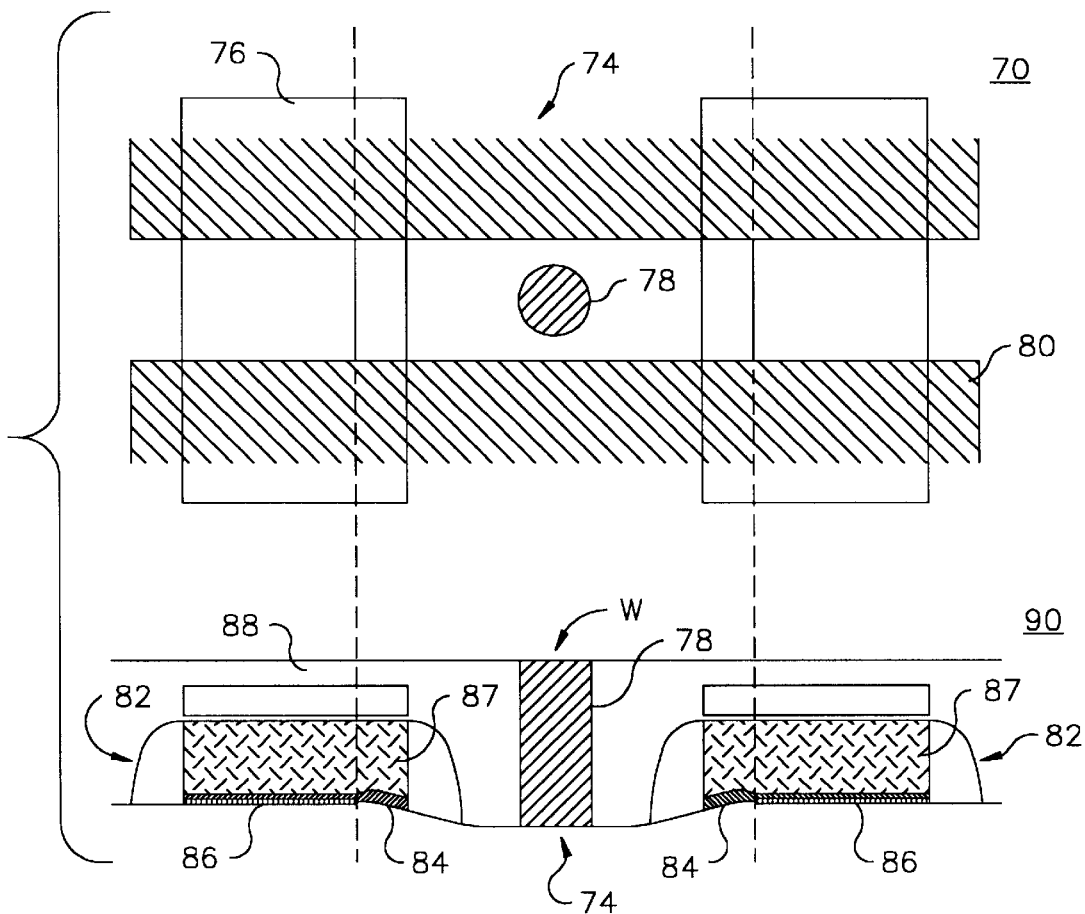
Fig. 6
Fig. 7
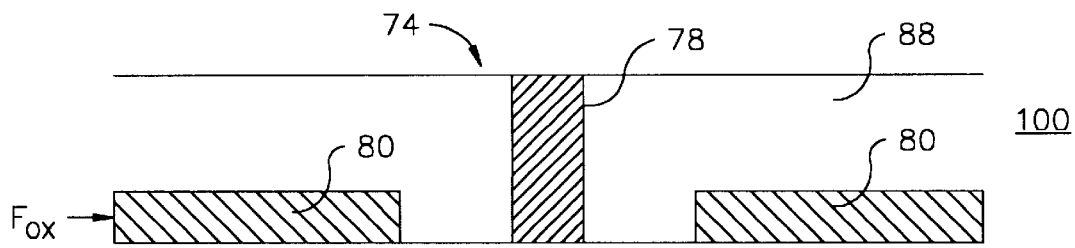
Fig. 8

HIGHLY EFFICIENT TRANSISTOR FOR FAST PROGRAMMING OF FLASH MEMORIES

BACKGROUND OF THE INVENTION

1. Field of the Invention

This invention relates to the field of semiconductor integrated circuit fabrication, and, in particular, to the field of fabricating transistors within semiconductor integrated memory cell circuits.

2. Background Art

Generally, a memory device can be a volatile memory device or a nonvolatile memory device. In volatile memory devices, old information can be erased and new information can be stored. In nonvolatile memory devices, programmed information is stored in the memory cells permanently.

The most common type of volatile memory device is the random access memory (RAM). RAMs are arrays of memory cells that store one bit of information in binary form. Information can be randomly written into or read out of each memory cell of RAMs as needed. Thus RAM is a read-write memory.

Read only memory (ROM) is a common type of nonvolatile memory device. Information is permanently stored in ROMs, as previously described, and thus only read operations can be performed.

Other types of nonvolatile memory devices, include erasable programmable memory (EPROM), electrically-erasable programmable memory (EEPROM) and flash EPROM memory. In EPROMs, EEPROMs and flash EPROM memories the stored information is erasable and new information can be programmed. These nonvolatile memories are programmed in substantially similar ways. However, the erasing operations of these memories are different. The EPROM can be erased only with ultraviolet light. The EEPROM and the flash memory can be erased electrically. EEPROMS and flash memories are therefore referred to as electrically alterable devices.

The EPROM and the EEPROM are basically the same in their fundamental structure and operation. However, the structure of the flash memory is different. For example, the flash memory cell is a single transistor memory cell, as compared with the more complicated architectures of the other erasable read only memory devices. Additionally, flash memories have floating gates.

Flash memories are finding widespread use in the smaller die sizes required in present day applications. One reason for their widespread use in smaller die sizes is the high memory cell densities that can be achieved using them. The major reason for the high density that is possible in flash memory cells is their single transistor architecture. Another reason they are finding widespread use is that they can be efficiently manufactured at low cost.

The transistors of floating gate flash memory cells are programmed by applying an electric field that injects hot electrons into the floating gates in order to store a charge oil the gates. The charge stored on the gates changes the effective threshold voltage of the transistors. This can be sensed by determining the voltage required to turn the transistor on.

The floating gates of the memory cells are deprogrammed by leaking the charge from the floating gates through an oxide layer into the substrate. The mechanism for leaking the charge from the gates is Fowler-Nordheim tunneling. One problem with floating gate flash memories is that the tunneling of electrons in this manner to deprogram the cells degrades the oxide through which the tunneling occurs.

In scaling erasable nonvolatile memory cells such as flash memory cells down to submicron dimensions however, problems arise. For example, the programming speed of the smaller devices is lower than the speed of the larger devices. Accordingly, the degree to which flash memory cells can be scaled down and integrated is restricted.

The problem of increasing the speed of flash memory cells is addressed in U.S. Pat. No. 5,432,106 entitled "Manufacture of Asymmetric Non-Volatile Memory Cell," issued on Jul. 11, 1995, to Hong. In particular, Hong teaches an asymmetric transistor for use in flash memory cells. In the transistor taught by Hong, source and drain ion implantation is provided using a large angle implant between about 15° and 45°. This angle generates an offset in the formation of the source and drain regions of the transistor. The offset in the transistor is provided in order to permit faster programming and deprogramming of the transistor.

U.S. Pat. No. 5,362,685, entitled "Method For Achieving A High Quality Thin Oxide in Integrated Circuit Devices," issued to Gardner et al. on Nov. 8, 1994, also addresses the problem of increasing the programming speed of flash memory devices. Gardner et al. teaches a gate oxide having varying thicknesses underneath the gate of a transistor. In the method taught by Gardner an etch operation is performed to provide a gate oxide over only a portion of a transistor channel region. An oxidation step then increases the thickness of the oxide gate while also growing oxide upon the surface area of the semiconductor.

It is therefore an object of the present invention to provide an improved flash memory cell within a semiconductor integrated circuit.

It is a further object of the present invention to provide an improved transistor structure within a flash memory cell.

It is a further object of the present invention to provide a flash memory cell that is less subject to degradation due to Fowler-Nordheim tunneling.

In particular, it is an object of the present invention to provide a transistor within a flash memory cell which permits faster programming and deprogramming of the flash memory cell.

These and other objects and advantages of the present invention will become more fully apparent from the description and claims which follow or may be learned by the practice of the invention.

SUMMARY OF THE INVENTION

In a semiconductor fabrication method for forming a transistor structure upon a semiconductor substrate, a nitride layer is formed over the semiconductor substrate. A gate oxide layer is also formed over the semiconductor substrate. The gate oxide layer has a relatively thinner oxide region in the vicinity of the nitride layer and a relatively thicker oxide region over the substrate adjacent the nitride layer. A transistor gate is formed extending over the relatively thinner oxide region and over the relatively thicker oxide region. The transistor thus formed is therefore asymmetric. A first transistor active region is formed in the vicinity of the relatively thicker oxide region and a second transistor active region is formed in the vicinity of the relatively thinner oxide region. The nitride layer can be formed by rapid thermal nitridization of the semiconductor substrate. The relatively thinner oxide region can be one-half as thick as the relatively thicker oxide region. The surface of the semiconductor substrate can be curved in the vicinity of the drain of the asymmetric transistor in order to permit the momentum of the charge carriers to facilitate penetration of the charge carriers into the gate.

BRIEF DESCRIPTION OF THE DRAWINGS

In order that the manner in which the above recited and other advantages and objects of the invention are obtained can be appreciated, a more particular description of the invention briefly described above is rendered by reference to a specific embodiment thereof which is illustrated in the appended drawings. Understanding that these drawings depict only a typical embodiment of the invention and are therefore not to be considered limiting of its scope, the invention and the presently understood best mode thereof are described and explained with additional specificity in detail through the use of the accompanying drawings.

FIG. 6 shows a top view of a floating gate flash memory cell including two asymmetric transistors formed in accordance with the method of the present invention as shown in FIGS. 1–5;

FIG. 7 shows a cross-sectional representation of the floating gate flash memory cell of FIG. 6;

FIG. 8 shows a cross-sectional representation of the floating gate memory cell of FIG. 7 rotated ninety degrees.

DETAILED DESCRIPTION OF THE INVENTION

Figure 1:
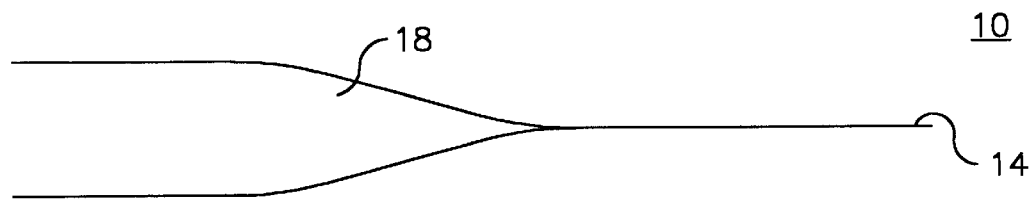
FIGS. 1–5 show cross-sectional representations of a semiconductor integrated circuit illustrating the method of the present invention for forming an asymmetric transistor for fast programming and deprogramming of flash memory cells.
Figure 2:
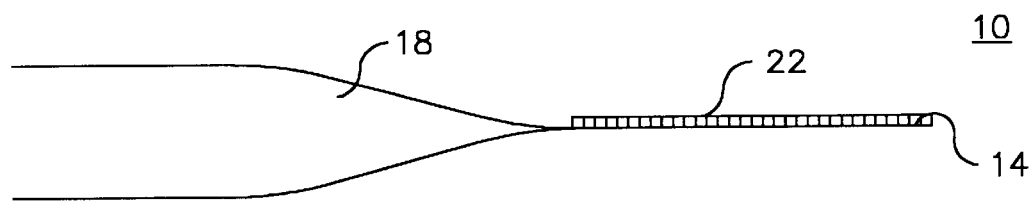
Figure 3:
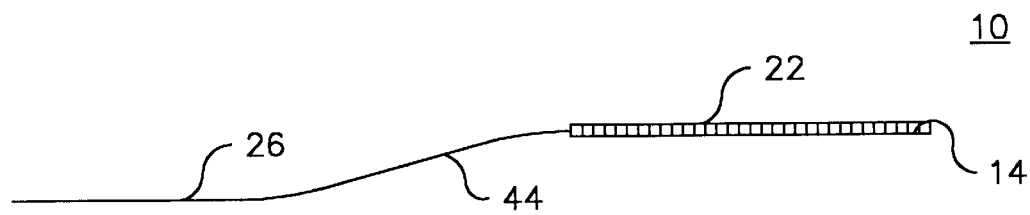
Figure 4:
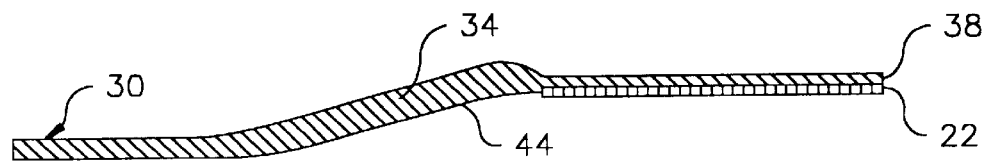
Figure 5:
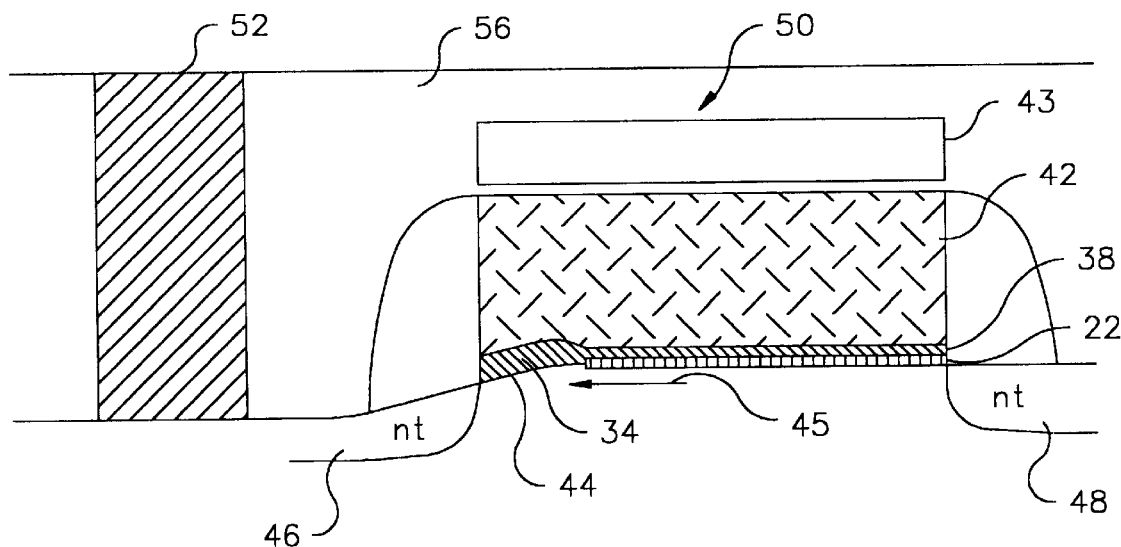

Referring now to FIGS. 1–5, there are shown cross-sectional representations of a semiconductor integrated circuit 10 illustrating the method of the present invention for forming an asymmetric transistor. Asymmetric transistors formed in accordance with the method of the present invention may be advantageously applied to the field of floating gate flash memory cells.

In the method of the present invention, field oxide layer 18 is formed upon semiconductor substrate 10 in a conventional manner. In the preferred embodiment of the invention, semiconductor substrate 10 can be formed of silicon. Field oxide layer 18, which can be approximately two thousand angstroms, defines substrate region 14 of semiconductor substrate 10. Rapid thermal nitridization can be performed in order to form nitride layer 22 upon the surface of substrate region 14.

It will be understood by those skilled in the art that the thickness of nitride layer 22 upon substrate region 14 can have a wide range of values. However, in the preferred embodiment of the asymmetric transistor of the present invention, nitride layer 22 can be approximately thirty angstroms. Field oxide layer 18 can then be removed from the surface of semiconductor substrate 10. Because the growth of field oxide layer 18 consumes some of the semiconductor material forming semiconductor substrate 10 beneath it, removal of field oxide layer 18 leaves a small indentation or curve in the surface of substrate 10 where field oxide layer 18 was formed. In this manner, contact region 26 having sloped surface 44 is formed in the vicinity of nitride layer 22. Substrate region 14 and contact region 26 of substrate 10 are suitable for forming the asymmetric transistor of the present invention thereupon.

Gate oxide layer 30 is then formed over the surface of semiconductor substrate 10. Any conventional method for oxidizing semiconductor substrate 10 to form gate oxide layer 30 can be used. For example, gate oxide layer 30 can be formed by rapid thermal heating of semiconductor substrate 10 at a temperature of 1000° C. in $O_2$ for 20 seconds at a pressure of one atmosphere.

Gate oxide layer 30 includes relatively thicker gate oxide region 34 in the vicinity of contact region 26 on the silicon surface of semiconductor substrate 10. At least a portion of relatively thicker gate oxide region 34 is disposed over sloped surface 44 of semiconductor substrate 10. The thicker gate oxide region 34 is self-aligned with sloped surface 44 in the embodiment shown in the drawings. Gate oxide layer 30 also includes relatively thinner gate oxide region 38. Relatively thinner gate oxide region 38 is formed upon nitride layer 22. The thickness of relatively thicker gate oxide region 34 can be between approximately fifty angstroms and approximately one hundred and fifty angstroms. In the preferred embodiment of the present invention, the thickness of relatively thicker gate oxide region 34 can be approximately one hundred angstroms. The thickness of relatively thinner gate, oxide region 38 can be approximately one-half the thickness of relatively thicker gate oxide region 34 due to the relative oxidation rates of the semiconductor material forming substrate 10 and the nitride forming nitride layer 22.

Thus, it will be understood by those skilled in the art that gate oxide region 34 of gate oxide layer 30 is thicker than gate oxide region 38 because the silicon which is oxidized to form gate oxide region 34 oxidizes more easily than the nitride layer 22 which is oxidized to form gate oxide region 38. Thus, it will be understood that in the preferred embodiment of the present invention the thickness of relatively thinner gate oxide region 38 is substantially determined by the amount of time required to form a predetermined thickness of relatively thicker gate oxide 34 and the thickness of nitride layer 22. Additionally, it will be understood that the rapid thermal heating of the present invention can produce three different structures. A single oxide layer can be formed over nitride layer 22 as described when temperatures substantially below 1000° C. are applied. Additionally, oxide layers can be formed both above and below the area of nitride layer 22 when temperatures substantially above 1000° C. are applied because the semiconductor material under nitride layer 22 can begin to oxidize. Finally, a layer of oxynitride can be formed in the area of nitride layer 22 when temperatures substantially close to 1000° C. are applied. It is believed that the oxynitride layer is preferred.

Thinner gate oxide region 38 is a nitride rich oxide layer due to the presence of nitride layer 22. Oxide region 38 can therefore be referred to as a nitridized gate oxide. Thinner gate oxide region 38 provides increased device endurance because nitrogen rich oxides have increased fluence values.

After gate oxide layer 30 is formed a layer of polycrystalline silicon is deposited over silicon semiconductor substrate 10. Gate definition is performed upon the polycrystalline silicon layer to form floating transistor gate 42. A portion of floating transistor gate 42 is defined over thinner gate oxide region 38. Another portion of floating transistor gate 42 is defined over a part of thicker gate oxide region 34 adjacent thinner oxide region 38. The thickness of floating transistor gate 42 can be approximately two thousand angstroms in the preferred embodiment of the invention. However, floating transistor gate 42 can have any thickness typical of known transistor gates. While floating gate 42 can be used to program and deprogram the asymmetric transistor formed in accordance with the preferred embodiment of the present invention, it will be understood that a control gate 43 can be provided above floating transistor gate 42 for the purpose of programming and deprogramming.

Self-aligned dopant implants of semiconductor substrate 10 are performed in a conventional manner well understood by those skilled in the art in order to form n+ transistor active regions 46, 48, wherein the term transistor active region is understood to refer to either a transistor source or a transistor drain. In the preferred embodiment of the invention, transistor active region 46 can be a drain and transistor active region 48 can be a source. In this manner, asymmetric transistor 50 of the present invention is formed.

Insulating layer 56 is deposited over semiconductor substrate 10, including over asymmetric transistor 50. Insulating layer 56 can be formed of BPSG or any other insulating material. Contact 52 is formed in an opening through insulating layer 56 in order to make electrical contact with asymmetric transistor 50. Contact 52 thus extends through insulating layer 56 from the top surface of insulating layer 56 to the surface of semiconductor substrate 10 where it makes contact with drain 46 of transistor 50.

Because gate oxide region 34 below floating gate 42 adjacent nitride layer 22 is thicker than gate oxide region 38 upon nitride layer 22, asymmetric transistor 50 is well adapted for the programming and deprogramming required of transistors within, flash memory cells. It is believed that this asymmetric transistor structure increases the injection of hot electrons into the drain end of gate 42 when programming transistor 50 for at least two reasons.

First, it is well known to those skilled in the art that thicker oxide layers such as thicker gate oxide 34 provide more reliable injection of hot carriers into the floating gate of a transistor because of longer lifetime of the gate oxide. Secondly, injection of hot carriers into thicker gate oxide 34 is assisted by the geometry of sloped surface 44 of semiconductor substrate 10. As electrons are accelerated towards drain 46 of asymmetric transistor 50 as indicated by arrow 45 some of them strike the thicker oxide layer 34 and penetrate the thicker oxide layer 34 because of their momentum and the geometry of sloped surface 44.

The asymmetric structure of transistor 50 also facilitates the Fowler-Nordheim tunneling of electrons out of floating gate 42 at the drain end when deprogramming transistor 50 because a thinner oxide layer such as thinner oxide layer 38 favors tunneling of electrons. It will be understood that the tunneling through oxide layer 38 does not cause oxide layer 38 to degrade as quickly as prior art oxide layers because oxide layer 38 is rich in nitrogen. Thus, in addition to permitting faster programming and deprogramming, asymmetric transistors formed in accordance with the present invention are more durable.

Referring now to FIGS. 6–8, there are shown three representations of flash memory 74, top representation 70, cross-sectional representation 90 and rotated cross-sectional representation 100. Cross-sectional representation 90 of flash memory 74 shows a portion of two flash memory cells, each including asymmetric transistor 82 formed in accordance with the method of the present invention. Asymmetric transistors 82 are each provided with relatively thinner gate oxide region 86 and relatively thicker gate oxide region 84 beneath transistor gate 87. Asymmetric transistors 82 are covered by insulating layer 88 and provided with common contact 78. Common contact 78 provides an electrical connection to the source of each asymmetric transistor 82. The use of common contact 78 in this manner saves space within a flash memory. Common contact 78 can be formed of tungsten.

As shown in top representation 70, flash memory 74 can be provided with field oxide layer 80 and polycrystalline silicon conductors 76 in a conventional manner. Rotated cross-sectional representation 100 illustrates flash memory 74 in a direction rotated ninety degrees with respect to the view of cross-sectional representation 90.

It is to be understood that although the present invention has been described with reference to a preferred embodiment, various modifications, known to those skilled in the art, can be made to the structure and process steps presented herein.

We claim:

1. A semiconductor integrated circuit formed upon a semiconductor substrate, comprising:

a nitride layer disposed over said semiconductor substrate, said nitride layer has a thickness of approximately thirty angstroms;

a gate oxide layer formed over said semiconductor substrate, said gate oxide layer having a relatively thinner oxide region disposed over the area of said nitride layer and a relatively thicker oxide region disposed adjacent said nitride layer;

a first transistor active region disposed adjacent said relatively thicker oxide region; and a second transistor active region disposed adjacent said relatively thinner oxide region.

2. A semiconductor integrated circuit formed upon a semiconductor substrate, comprising:

a nitride layer disposed over said semiconductor substrate, said nitride layer is disposed in the vicinity of a sloped surface of said semiconductor substrate;

a gate oxide layer formed over said semiconductor substrate, said gate oxide layer having a relatively thinner oxide region disposed over the area of said nitride layer and a relatively thicker oxide region disposed adjacent said nitride layer, said relatively thicker oxide region is disposed over said sloped substrate;

a first transistor active region disposed adjacent said relatively thicker oxide region; and a second transistor active region disposed adjacent said relatively thinner oxide region.

3. A semiconductor integrated circuit formed upon a semiconductor substrate, comprising:

a nitride layer disposed over said semiconductor substrate;

a gate oxide layer formed over said semiconductor substrate, said gate oxide layer having a relatively thinner oxide region disposed over the area of said nitride layer and a relatively thicker oxide region disposed adjacent said nitride layer, wherein said relatively thicker oxide region has a thickness of between approximately fifty angstroms and approximately one hundred-fifty angstroms;

a first transistor active region disposed adjacent said relatively thicker oxide region; and a second transistor active region disposed adjacent said relatively thinner oxide region.

4. A semiconductor integrated circuit formed upon a semiconductor substrate, comprising:

a nitride layer disposed over said semiconductor substrate, said nitride layer is disposed in the vicinity of a sloped surface of said semiconductor substrate;

a gate oxide layer formed over said semiconductor substrate, said gate oxide layer having a relatively thinner oxide region disposed over the area of said nitride layer and a relatively thicker oxide region disposed adjacent said nitride layer, wherein said relatively thicker oxide region is self-aligned with said sloped surface;

a first transistor active region disposed adjacent said relatively thicker oxide region; and a second transistor active region disposed adjacent said relatively thinner oxide region.

5. The semiconductor integrated circuit of claim 1, wherein said nitride layer is disposed in the vicinity of a sloped surface of said semiconductor substrate.

6. The semiconductor integrated circuit of claim 5, wherein said relatively thicker oxide region is disposed over said sloped substrate.

7. The semiconductor integrated circuit of claim 1, wherein said relatively thicker oxide region has a thickness of between approximately fifty angstroms and approximately one hundred-fifty angstroms.

8. The semiconductor integrated circuit of claim 3, wherein said relatively thicker oxide region has a thickness of approximately one hundred angstroms.

9. The semiconductor integrated circuit of claim 1, wherein said first transistor active region comprises a transistor drain.

10. The semiconductor integrated circuit of claim 9, wherein said second transistor active region comprises a transistor source.

11. The semiconductor integrated circuit of claim 10, further comprising a contact adjacent said transistor drain.

12. The semiconductor integrated circuit of claim 11, further comprising an insulating layer disposed over said semiconductor substrate, said insulating layer having an opening for said contact to extend therethrough and make electrical contact with said transistor drain.

13. The semiconductor integrated circuit of claim 1, wherein said relatively thinner gate oxide region includes a single oxide layer disposed over said nitride layer.

14. The semiconductor integrated circuit of claim 1, wherein said relatively thinner gate oxide region includes oxide layers disposed over and below said nitride layer.

15. The semiconductor integrated circuit of claim 1, wherein said relatively thinner gate oxide region includes a layer of oxynitride.

16. The semiconductor integrated circuit of claim 5, wherein said relatively thicker oxide region is self-aligned with said sloped surface.

* * * * *